(12) United States Patent
Liu et al.

(10) Patent No.: US 11,664,788 B2
(45) Date of Patent: May 30, 2023

(54) CHIP, SELF-CALIBRATION CIRCUIT AND METHOD FOR CHIP PARAMETER OFFSET UPON POWER-UP

(71) Applicant: Fremont Micro Devices Corporation, Guangdong (CN)

(72) Inventors: Jianfeng Liu, Guangdong (CN); Yuquan Huang, Guangdong (CN); Dennis Sinitsky, Guangdong (CN)

(73) Assignee: Fremont Micro Devices Corporation, Shenzhen (CN)

( * ) Notice: Subject to any disclaimer, the term of this patent is extended or adjusted under 35 U.S.C. 154(b) by 0 days.

(21) Appl. No.: 17/680,287

(22) Filed: Feb. 24, 2022

(65) Prior Publication Data

US 2022/0393670 A1 Dec. 8, 2022

(30) Foreign Application Priority Data

Jun. 3, 2021 (CN) .......................... 202110622271.0

(51) Int. Cl.
*G01R 31/28* (2006.01)
*H03K 3/037* (2006.01)
*H03K 23/00* (2006.01)

(52) U.S. Cl.
CPC ......... *H03K 3/037* (2013.01); *G01R 31/2855* (2013.01); *H03K 23/00* (2013.01)

(58) Field of Classification Search
CPC ............ G01R 31/2856; G01R 31/2875; G01R 31/2877
See application file for complete search history.

(56) References Cited

U.S. PATENT DOCUMENTS

| 2009/0067266 A1* | 3/2009 | Roohparvar | G11C 29/50 |
| | | | 365/189.16 |
| 2015/0061636 A1* | 3/2015 | Tsai | G01R 35/005 |
| | | | 324/74 |
| 2022/0014207 A1* | 1/2022 | Minotani | G01R 35/00 |

* cited by examiner

*Primary Examiner* — Tung X Nguyen (57) ABSTRACT

A chip, a self-calibration circuit and method for chip parameter offset upon power-up are disclosed. The circuit includes a counting circuit, a calibration data latch circuit, a calibration data selection circuit and a parameter calibration circuit. The counting circuit outputs a sequentially scanned counting signal when receiving a valid enabling signal. The calibration data latch circuit latches the counting signal when receiving a valid latch signal. The calibration data selection circuit selects the counting signal latched by the calibration data latch circuit as a calibration signal when receiving the valid latch signal, otherwise selects the counting signal currently outputted as the calibration signal. The parameter calibration circuit implements a parameter calibration based on the calibration signal in a calibration mode, while outputs the valid latch signal when the parameter calibration satisfies a preset requirement. Thus, a parameter calibration with a higher accuracy and flexibility is realized in a cheaper way.

12 Claims, 6 Drawing Sheets

CHIP, SELF-CALIBRATION CIRCUIT AND METHOD FOR CHIP PARAMETER OFFSET UPON POWER-UP

CROSS-REFERENCE TO RELATED APPLICATIONS

This application claims a priority of a Chinese application No. 202110622271.0, filed on Jun. 3, 2021, the content of which is incorporated herein by reference in its entirety.

TECHNICAL FIELD

The disclosure relates to the technical field of a chip, and more particularly to a chip, a self-calibration circuit and method for chip parameter offset upon power-up.

BACKGROUND

At present, the commonly used parameter burn-in and adjustment methods are basically divided into two types, one of which refers to a parameter burn-in and adjustment method during a wafer level, and the other one of which refers to a parameter burn-in and adjustment method during a chip level.

Among them, the parameter burn-in and adjustment method during a wafer level can further be divided into following two types.

One refers to a pure PAD burn-in and adjustment method, which is simple and does not require a burn-in and adjustment data detection circuit. But the number of pads needed to be burned and adjusted should be increased and a fuse should be employed in this method.

The other one refers to a PAD burn-in and adjustment method, which requires a burn-in and adjustment data detection circuit. This method still requires the fuse. Although it can appropriately reduce the number of pads, it still need to use the additional detection circuit which brings a certain power consumption.

Among them, the parameter burn-in and adjustment method during a chip level can further be divided into following three types.

The first one refers to an OTP burn-in and adjustment method, which can be realized through a disposable non-erasable circuit. This method requires a special process and high design capacity of the chip design company, so it requires high cost whether it is self-designed or purchased.

The second one refers to a memory burn-in and adjustment method, which can be realized through programing an erasable memory circuit. Similarly, this method still requires a special process and high design capacity of the chip design company, so it also requires high cost whether it is self-designed or purchased.

The third one refers to a protocol burn-in and adjustment method, which requires no special process. But this method still requires the detection circuit, fuse, and large-size switch tubes. Meanwhile, it also needs a protocol circuit to process the burn-in and adjustment signal, and the circuit cost is relatively large.

At present, the commonly used parameter burn-in and adjustment method during a wafer level, may lead to a deviation between the measured value and the actual value due to the needle piercing force of the test needle card and the parameter test environment of the tester. If the burn-in and adjustment process are implemented according to the abnormal measured values, the obtained parameters will be irreversibly offset, which are finally embodied as the poor accuracy of the chip. At the same time, forming the packaging chip through wiring and plastic packaging the wafer will also lead to the parameter dispersion. Although these problems can be solved by the parameter burn-in and adjustment method during a chip level, however, PCB parasitic will also bring errors when the system works, resulting in the deviations in chip parameters, which will eventually embodied as the poor accuracy of the chip working system.

SUMMARY

In this regard, a chip, a self-calibration circuit and method for chip parameter offset upon power-up, are provided in this disclosure, aiming at the above defects.

In a first aspect, a self-calibration circuit for chip parameter offset upon power-up, is provided, which including:

a counting circuit, which is operable to output a sequentially scanned counting signal when receiving a valid enabling signal which indicates a completion of chip power-up;

a calibration data latch circuit, which is connected with the counting circuit and operable to latch the counting signal currently output by the counting circuit when receiving a valid latch signal;

a calibration data selection circuit, which is respectively connected with the counting circuit and the calibration data latch circuit, and is operable to select the counting signal latched by the calibration data latch circuit as a calibration signal for outputting when receiving the valid latch signal, and to select the counting signal currently output by the counting circuit as the calibration signal for outputting when not receiving the valid latch signal; and a parameter calibration circuit, which is respectively connected with the calibration data latch circuit and the calibration data selection circuit, and is operable to implement a parameter calibration based on the calibration signal output by the calibration data selection circuit in a calibration mode, and to output the valid latch signal when the parameter calibration satisfies a preset requirement.

Preferably, there are a plurality of calibration data latch circuits, a plurality of calibration data selection circuits, and a plurality of parameter calibration circuits, and wherein each parameter corresponds to one calibration data latch circuit, one calibration data selection circuit and one parameter calibration circuit.

Preferably, the self-calibration circuit for chip parameter offset upon power-up, further includes a parameter calibration completion circuit, which is connected with the parameter calibration circuits, and is operable to output a calibration completion signal to all of the parameter calibration circuits when the parameter calibration circuits all output the valid latch signal;

wherein the parameter calibration circuit is in the calibration mode when not receiving the calibration completion signal, and switches from the calibration mode to a normal working mode after receiving the calibration completion signal.

Preferably, the counting signal is a binary signal, wherein when receiving the valid enabling signal which indicates a completion of chip power-up, the counting circuit is operable to output the binary signal which just includes zero, and then the binary signal is incremented step by step until the binary signal just includes one, wherein one is added in each increment.

In a second aspect, a chip is provided, which includes any one of the self-calibration circuit for chip parameter offset upon power-up discussed above.

In a third aspect, a self-calibration method for chip parameter offset upon power-up, is provided, which including:

outputting a sequentially scanned counting signal when receiving a valid enabling signal which indicates a completion of chip power-up, by a counting circuit;

latching the counting signal currently output by the counting circuit when receiving a valid latch signal, by a calibration data latch circuit;

selecting the counting signal latched by the calibration data latch circuit as a calibration signal for outputting when receiving the valid latch signal, and selecting the counting signal currently output by the counting circuit as the calibration signal for outputting when not receiving the valid latch signal, by a calibration data selection circuit; and implementing a parameter calibration based on the calibration signal output by the calibration data selection circuit in a calibration mode, and outputting the valid latch signal when the parameter calibration satisfies a preset requirement, by a parameter calibration circuit.

Preferably, there are a plurality of calibration data latch circuits, a plurality of calibration data selection circuits, and a plurality of parameter calibration circuits, and wherein each parameter corresponds to one calibration data latch circuit, one calibration data selection circuit and one parameter calibration circuit.

Preferably, the self-calibration method for chip parameter offset upon power-up further includes:

setting the parameter calibration circuit in the calibration mode when not receiving the calibration completion signal, outputting a calibration completion signal to all of the parameter calibration circuits when the parameter calibration circuits all output the valid latch signal, by a parameter calibration completion circuit; and switching the parameter calibration circuit from the calibration mode to a normal working mode after receiving the calibration completion signal.

Preferably, the counting signal is a binary signal, wherein when receiving the valid enabling signal which indicates a completion of chip power-up, the counting circuit is operable to output the binary signal which just includes zero, and then the binary signal is incremented step by step until the binary signal just includes one, wherein one is added in each increment.

The chip, self-calibration circuit and method for chip parameter offset upon power-up provided in this disclosure, have following beneficial effects. Through the self-calibration for the chip parameter upon power-up during the system working process, the parameter offsets caused by wiring and plastic packaging and the parameter deviation caused by system parasitism have been included at this time. Accordingly, all possible errors under the working conditions of the chip system are included. On this basis, the parameter calibration can achieve higher accuracy. Accordingly, the present disclosure has realized a parameter calibration which has higher accuracy and flexibility but requires no special process, so can be implemented in a cheaper way. The circuit structure is simple, and the cost is low. In additional, the detection and calibration are implemented in each time of power-up, which avoids the problem that the traditional fuse and OTP burn-in and adjustment method can only be calibrated once. Accordingly, the self-calibration of this disclosure has a high flexibility, and its integrated self-detection function can also improve the parameter detection accuracy.

BRIEF DESCRIPTION OF THE DRAWINGS

In order to explain embodiments of this disclosure or technical solutions in the prior art more clearly, the following will briefly introduce drawings required in the description for the embodiments or the prior art description. It is obvious that the drawings in the following description are only some embodiments of this disclosure. For those skilled in the art, other drawings can be obtained from these accompanying drawings without paying any creative works.

DESCRIPTION OF THE PREFERRED EMBODIMENTS

The technical solutions in example embodiments of the disclosure will be described clearly and completely below with reference to the accompanying drawings. Typical embodiments of this disclosure are given in the accompanying drawings. However, this disclosure can be implemented in many different forms and is not limited to the embodiments described herein. On the contrary, the purpose of providing these embodiments is to make the description of this disclosure more thorough and comprehensive.

It should be noted that when a component is called "fixed to" another component, it can be directly on another component or there can be any intermediate components. When a component is considered to be "connected" to another component, it can be directly connected to another component or there may be intermediate components at the same time. The terms "vertical", "horizontal", "left", "right" and similar expressions used in this disclosure are just for illustrative purposes only.

Unless otherwise defined, all technical and scientific terms used herein have the same meanings as those generally understood by those skilled in the technical field of this disclosure. The terms used in the description of this disclosure herein are only for the purpose of describing specific embodiments and are not intended to limit this disclosure.

A general idea of this disclosure is that in each time of chip power-up, the chip parameters are automatically calibrated as follows. The counting circuit outputs a sequentially scanned counting signal when receiving a valid enabling signal which indicates a completion of chip power-up. The calibration data latch circuit latches the counting signal currently output by the counting circuit when receiving a valid latch signal. The calibration data selection circuit selects the counting signal latched by the calibration data latch circuit as a calibration signal for outputting when receiving the valid latch signal, while selects the counting signal currently output by the counting circuit as the calibration signal for outputting when not receiving the valid latch signal. The parameter calibration circuit implements a parameter calibration based on the calibration signal output by the calibration data selection circuit in a calibration mode, while outputs the valid latch signal when the parameter calibration satisfies a preset requirement.

In order to better understand the above technical scheme, the above technical scheme will be described in detail below in combination with the description, drawings, and specific embodiments. It should be understood that the embodiments of this disclosure and the specific features in the embodiments are a detailed description of the technical scheme of this disclosure, rather than a limitation of the technical scheme of this disclosure. Without conflict, the embodiments of this disclosure and the technical features in the embodiments can be combined with each other.

Figure 1:
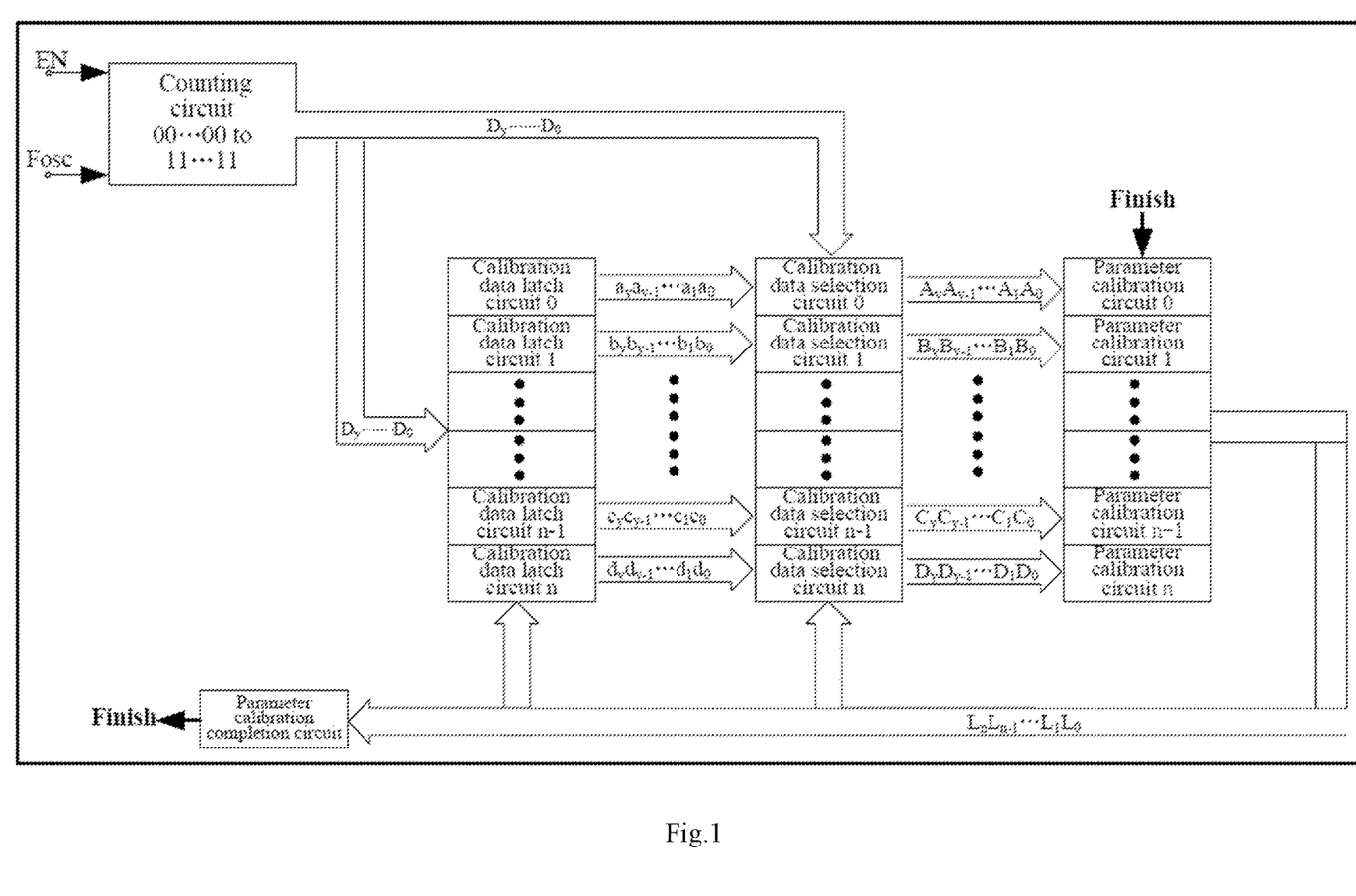
FIG. 1 is a schematic diagram of a self-calibration circuit for chip parameter offset upon power-up according to an embodiment of the present disclosure.

Referring FIG. 1, in one specific embodiment, a self-calibration circuit for chip parameter offset upon power-up, includes a counting circuit, a calibration data latch circuit, a calibration data selection circuit, a parameter calibration circuit and a parameter calibration completion circuit.

It is understood that the self-calibration circuit for chip parameter offset upon power-up in the present disclosure can calibrate one or more parameters. When there are a plurality of parameters, there are a plurality of calibration data latch circuits, a plurality of calibration data selection circuits, and a plurality of parameter calibration circuits. Each parameter corresponds to one calibration data latch circuit, one calibration data selection circuit and one parameter calibration circuit. As shown in FIG. 1, the situation that includes n+1 parameters, is disclosed, wherein n is a positive integer. FIG. 1 has shown the calibration of parameter 0, parameter 1, . . . , and parameter n.

Each circuit module in the self-calibration circuit for chip parameter offset upon power-up of the present disclosure are introduced in turn as follows.

a) Counting Circuit

The counting circuit is operable to output a sequentially scanned counting signal $D_y$-$D_0$ when receiving a valid enabling signal EN which indicates a completion of chip power-up. The functions of the counting circuit can be realized in a variety of circuits through the integration of a sequential logic circuit and a combinational logic circuit.

Specifically, the counting circuit has two input signals, one is the enabling signal EN which indicates a completion of chip power-up, while the other one is a signal Fosc. The enabling signal EN which indicates a completion of chip power-up can be provided by a power-up reset module. The valid enabling signal EN which indicates a completion of chip power-up can be a high level. That is, when the enabling signal EN which indicates a completion of chip power-up is a high level, the counting signal $D_y$-$D_0$ is outputted. The signal Fosc is a counting clock signal, which can be provided through a frequency division circuit based on a clock signal generated by an OSC module of the chip. If the chip itself does not include the OSC module, a simple OSC circuit can be additional provided. After all the chip parameters of the chip are calibrated, the OSC circuit can be turned off or not according to the design requirements.

Figure 2:
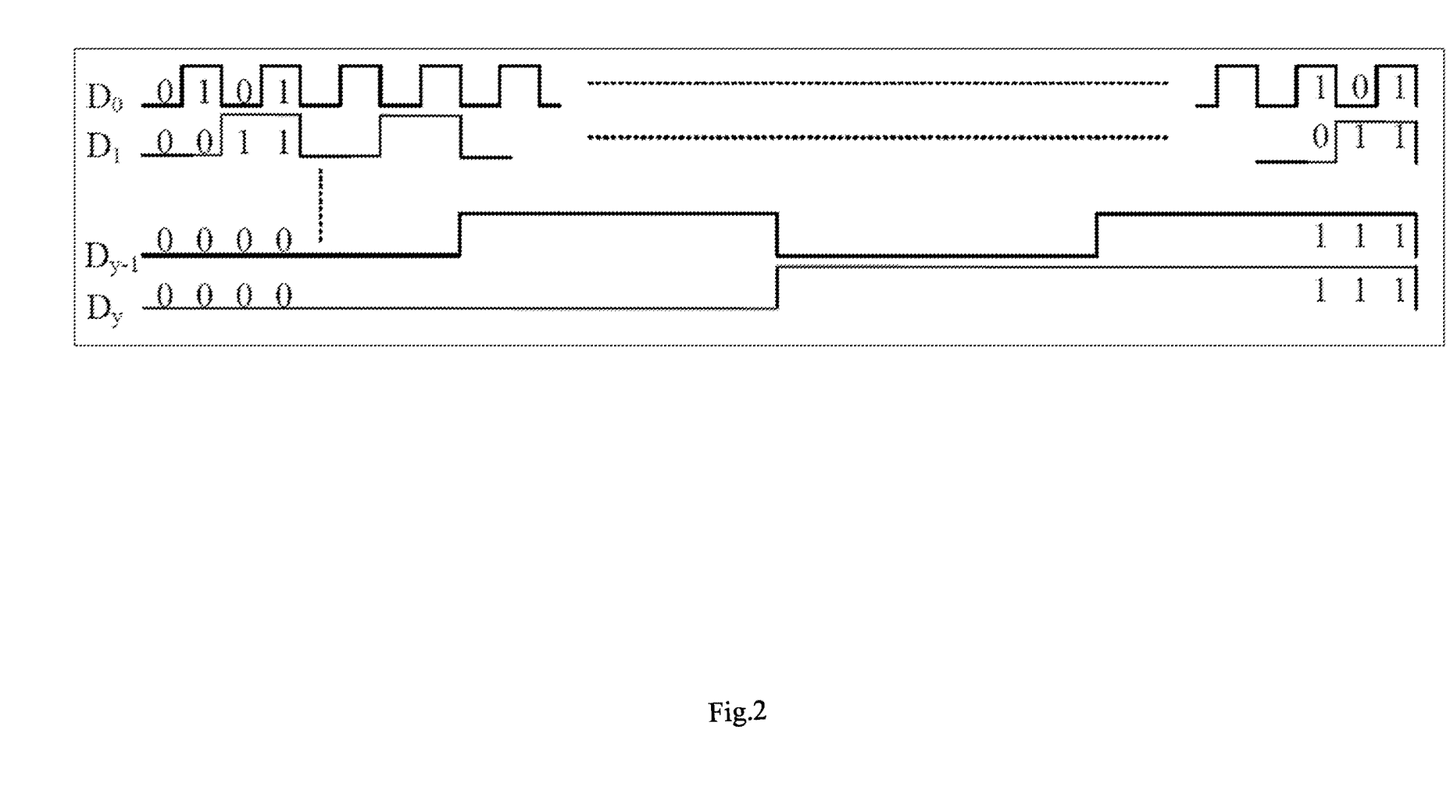
FIG. 2 is a waveform diagram of a counting signal.

Specifically, the counting circuit has just one output signal, that is, the counting signal $D_y$-$D_0$. Specifically, the counting signal $D_y$-$D_0$ is a binary signal. When the counting circuit receives the valid enabling signal EN which indicates a completion of chip power-up, the counting circuit outputs the binary signal which just includes zero, and then the binary signal is incremented step by step until the binary signal just includes one, wherein one is added in each increment. The letter "y" in the counting signal $D_y$-$D_0$ refers to the number of the counting signal $D_y$-$D_0$ and is determined by the bits which needs to be calibrated by the parameter calibration circuit. Supposing that the bits which needs to be calibrated by the parameter calibration circuit is p, then y=p. Now, we take 4 bits for example, the letter "y" in the counting signal $D_y$-$D_0$ is 3, and the counting signal $D_y$-$D_0$ should be counting signal $D_3$-$D_0$. As shown in FIG. 2, $D_3$ is the highest bit, $D_0$ is the lowest bit. Accordingly, the counting signal $D_y$-$D_0$ are 0000, 0001, 0010, 0011, 0100, 0101, 0110, 0111, 1000, 1001, 1010, 1011, 1100, 1101, 1110, 1111 successively according to the scanning sequence, that is, according to the sequence of the output time.

b) Calibration Data Latch Circuit

The calibration data latch circuits n–0 are connected with the counting circuit and operable to latch the counting signal $D_y$-$D_0$ currently output by the counting circuit when receiving a valid latch signal $L_0$-$L_n$, wherein n is related to the number of the parameters. We record the counting signal $D_y$-$D_0$ currently output by the counting circuit as $a_n$-$a_0$. The functions of the calibration data latch circuit can be realized in a variety of circuits through the integration of a sequential logic circuit and a combinational logic circuit.

For example, taking the parameter 0 for example, suppose that when the counting circuit counts to one counting signal $D_3$-$D_0$, such as 0100, and now the parameter calibration circuit 0 generates a switching signal $L_0$ which switches from 0 to 1 as the valid latch signal and inputs the valid latch signal into the calibration data latch circuit 0, then the calibration data latch circuit 0 will latch the counting signal $D_3$-$D_0$ at this time. As the current output signal of the counting circuit $D_3$-$D_0$=0100, so the output signal latched by the calibration data latch circuit is $a_3$-$a_0$=0100.

c) Calibration Data Selection Circuit.

The calibration data selection circuits n–0 are respectively connected with the counting circuit and the corresponding calibration data latch circuits n–0, and are operable to select the counting signal $a_n$-$a_0$ latched by the calibration data latch circuit as a calibration signal $A_n$-$A_0$ for outputting when receiving the valid latch signal $L_0$-$L_n$, and to select the counting signal $D_y$-$D_0$ currently output by the counting circuit as the calibration signal $A_n$-$A_0$ for outputting when not receiving the valid latch signal $L_0$-$L_n$. That is, the calibration data selection circuits n–0 in the present disclosure, can decide the calibration signal $A_n$-$A_0$ which is then input into the following parameter calibration circuits n–0 according to input latch signal $L_0$-$L_n$.

Continuing the above example, after the parameter calibration circuit 0 generates one switching signal $L_0$ which switches from 0 to 1, the switching signal $L_0$ is also input into the calibration data selection circuit 0. When the switching signal is 0, the output signal $A_3$-$A_0$ of the calibration data selection circuit 0 should be $A_3$-$A_0$=$D_3$-$D_0$. Accordingly, the parameter calibration circuit 0 receives the counting signal $D_3$-$D_0$ which is counted step by step. When counting to one counting signal $D_3$-$D_0$=0100 and now the switching signal $L_0$ output by the parameter calibration circuit 0 is 1, then the switching signal $L_0$ belongs to a valid latch signal, so $A_3$-$A_0$=$a_3$-$a_0$. At this time, the signal $A_3$-$A_0$ is kept as the latched value $a_3$-$a_0$ (that is, 0100) of the parameter calibration circuit 0, in the condition that the chip is not power off.

d) Parameter Calibration Circuit

The parameter calibration circuits n–0 are respectively connected with the calibration data latch circuits n–0 and the calibration data selection circuits n–0. The parameter calibration circuits n–0 are operable to implement a parameter calibration based on the calibration signal output by the calibration data selection circuit in a calibration mode, and to output the valid latch signal $L_n$-$L_0$ when the parameter calibration satisfies a preset requirement. In this disclosure, the parameter calibration circuits never specially specify any circuit, and can be involved in any applications where parameters need to be calibrated.

Specifically, when the parameter calibration circuits n–0 do not receive a calibration completion signal Finish, they are in the calibration mode. In the calibration mode, parameter input signals are blocked and the calibration signal output by the corresponding calibration data selection circuits n–0 are employed for calibration. When receiving the calibration completion signal Finish, the parameter calibration circuits n–0 switch to a normal working mode. That is, the parameter calibration circuits n–0 return to the normal working circuit state. In this mode, the parameter input signal of the chip is accessed, and the parameter input signal is calibrated based on the counting signal which is calibrated and latched, and then output by the calibration data selection circuit n–0.

It should be noted that the number of bits of the calibration signal of the calibration data selection circuit is determined by the demand of the parameter calibration circuit. If the parameter calibration circuit 0 needs to calibrate the parameter of 4 bits, the calibration data selection circuit 0 will output $A_3$–$A_0$. If the parameter calibration circuit 1 needs to calibrate the parameter of 2 bits, the calibration data selection circuit 1 will output $B_1$–$B_0$, and so on. If the parameter calibration circuit n needs to calibrate the parameter of 7 bits, the calibration data selection circuit n will output $D_6$–$D_0$.

e) Parameter Calibration Completion Circuit

The parameter calibration completion circuit is connected with the parameter calibration circuits n–0. The parameter calibration completion circuit is operable to output the calibration completion signal Finish to all of the parameter calibration circuits n–0 when the parameter calibration circuits n–0 all output the valid latch signal $L_n$–$L_0$. The calibration completion signal Finish is used as the enable signal for the normal operation of the whole chip and is also used as the input signal to enable the parameter calibration circuits n–0 to exit the calibration mode and return to the normal circuit state. The function of the parameter calibration completion circuit can be realized in a variety of circuits through the integration of a sequential logic circuit and a combinational logic circuit.

It can be understood that when there are a plurality of parameters, the self-calibration circuit for chip parameter offset upon power-up, disclosed in this disclosure, can calibrate the plurality of parameters synchronously. In this condition, the counting signal output by the counting circuit is sent to the calibration data selection circuits and calibration data latch circuits of all parameters at the same time. Of course, the self-calibration circuit for chip parameter offset upon power-up, disclosed in this disclosure, can also calibrate the specific parameter calibration circuits in a specific order according to specific requirements. For example, the parameters 0–n can be calibrated one by one according to their order. In this condition, the sequentially scanned counting signal output by the counting circuit can be send to the calibration data selection circuit and calibration data latch circuit of the first parameter to calibrate the first parameter. After the calibration of the first parameter is completed, the sequentially scanned count signal is output again to the calibration data selection circuit and calibration data latch circuit of the second parameter to calibrate the second parameter, and so on. For another example, a specific order of calibration can also be employed, such as the parameters 1, 2, 3 and 4 can be associated in a specific order, while the other parameters are independent. Accordingly, the parameters 0, 1, 5, 6, . . . n–1 and n can be calibrated at the same time, then the parameter 2 is calibrated. After that, the parameter 3 is calibrated, and finally the parameter 4 is calibrated. If parameters 1 and 2 are associated, parameter 2 is associated with parameters 3 and 4, while parameter 3 and parameter 4 are independent from each other, then the self-calibration circuit for chip parameter offset upon power-up, disclosed in this disclosure, can calibrate parameters 0, 1, 5, 6, . . . n–1 and n at the same time, then calibrate the parameter 2, and finally calibrate the parameter 3 and parameter 4 at the same time.

The specific example of the self-calibration circuit for chip parameter offset upon power-up disclosed in this disclosure is illustrated as follows.

Figure 3:
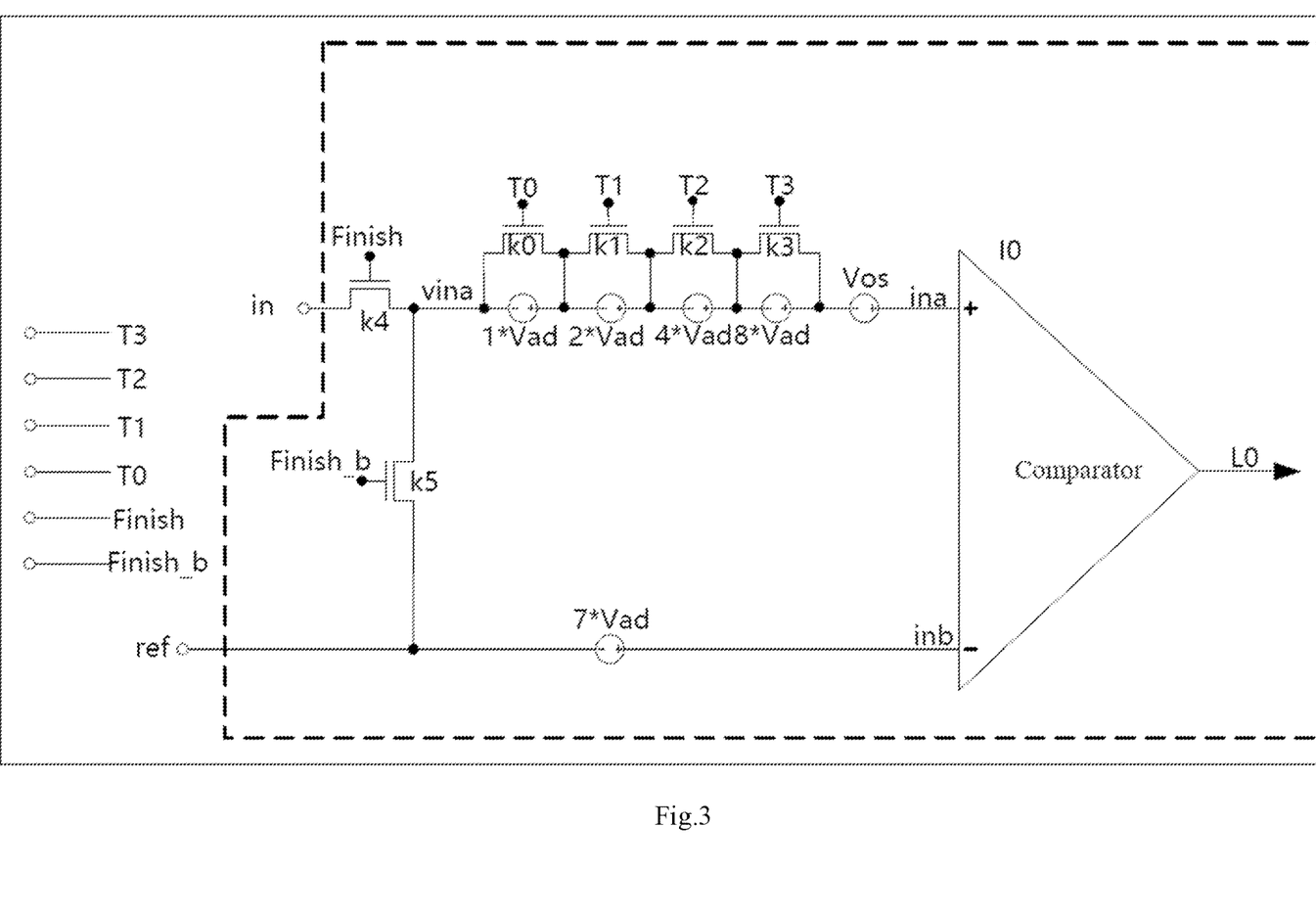
FIG. 3 is a schematic diagram of a parameter calibration circuit of 4 bits.

As shown in FIG. 3, the parameter calibration circuit 0 of 4 bits is taken for example. The input signals of the parameter calibration circuit 0 are signal vina/ref, signal Finish and signal $T_3$–$T_0$. Wherein the signal Finish is effective when it is a high level and the signal Finish_b refers to an opposite logic signal of the signal Finish. The signal $T_3$–$T_0$ are output signals $A_3$–$A_0$ of the calibration data selection circuit 0. The signal ref is used as the input reference signal which can be generated by other modules inside the chip or provided by other chips of the system. It can include a voltage signal between the ground and the power supply or a current signal. Here, in order to describe the working principle of the module, the voltage signal is taken only as an example. Parameter calibration circuit 0 output signal $L_0$. $k_5$–$k_0$ refers to MOS switches which can be switched on by a high level and switched off by a low level. The ideal working condition of the parameter calibration circuit 0 is that when ref=in, ina=inb. However, the comparator will inevitably have offset error $V_{os}$. The parameter calibration circuit 0 calibrates the offset error $V_{os}$ to the acceptable error range of the circuit. That is, before the parameter calibration, due to the existence of offset error $V_{os}$, the state switching point of $L_0$ is:

$$in + V_{os} = ref;$$

wherein $V_{err}$ is the offset error of the whole parameter calibration completion circuit, wherein, the ideal value of which is 0V. After the parameter calibration, the state switching point of $L_0$ is calibrated as:

$$in \pm V_{err} = ref;$$

wherein $V_{err}$ represents the acceptable deviation voltage of comparator I0. Herein, the commonly used comparator module is taken as an example, which can also be replaced by other similar comparison circuits. According to the internal circuit shown in FIG. 3, if inb=ina±$V_{err}$ is satisfied when vina=ref, in±$V_{err}$=ref can be equivalently satisfied. Accordingly, when the parameter calibration circuit 0 enters the calibration mode, vina=ref should be satisfied. Accordingly, the Finish signal is used to switch off the MOS switch $k_4$ to disconnect the input terminal in and the input terminal vina of the parameter calibration circuit 0. Meanwhile, the Finish_b is used to switch on the MOS switch $k_5$ to connect the input terminal vina of the parameter calibration circuit 0 with the terminal ref. Therefore, the following equation can be intuitively obtained from FIG. 3:

$$Ina = vina + T3*8*V_{ad} + T2*4*V_{ad} + T1*2*V_{ad} + T0*1*V_{ad} + V_{os} \quad (1);$$

$$Inb = ref + 7*V_{ad} \quad (2).$$

In combination with equations (1) and (2), we can obtain that, in order to satisfy that the state switching point of $L_0$ is in±$V_{err}$=ref after the parameter correction, the minimum calibration step needs to be designed as $2*V_{err}$, and the minimum calibration step in FIG. 3 is the voltage of $k_0$ channel, which has a voltage value of $1*V_{ad}$. That is, $0.5*V_{ad}=V_{err}$. After the parameter correction, the state switching point of $L_0$ is calibrated as:

$$in \pm 0.5 * V_{ad} = \text{ref.}$$

The functions of comparator $I_0$ are defined as follows.

If Inb>ina-$V_{err}$, the output signal $L_0$ of $I_0$ is a low level. On the contrary, if Inb≤ina-$V_{err}$, the output of $I_0$ is a high level.

According to equation (1), we can obtain that ina_min=vina+$V_{os}$ and ina_max=vina+15*$V_{ad}$+$V_{os}$; wherein ina_min is the minimum value of the ina terminal and ina_max is the maximum value of the ina terminal. Under the condition of 4 bits calibration, the voltage $V_{os}$ that can be calibrated ranges from $-7.5*V_{ad}$–$8.5*V_{ad}$. If the voltage $V_{os}$ exceeds this range, it cannot be calibrated to inb=ina±$V_{err}$. Therefore, the $V_{ad}$ voltage and the number of calibration bits must be designed and selected according to the system requirements in the design of the parameter calibration circuit.

Figure 4:
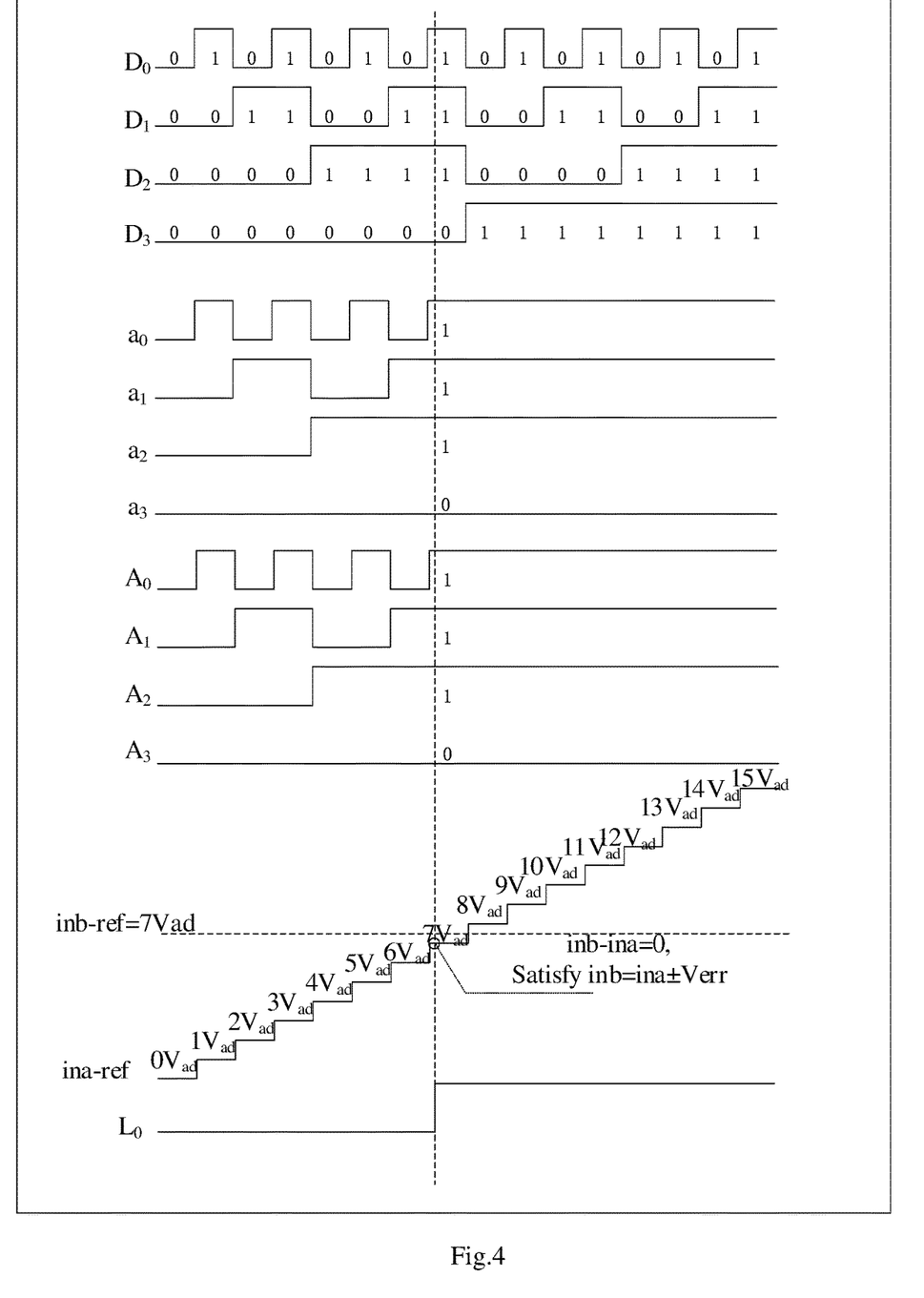
FIG. 4 is a working flow chart of a parameter calibration circuit when $V_{os}=0V$.

When $V_{os}$=0V, the calibration flow diagram of the parameter calibration circuit 0 is shown in FIG. 4. Combining equations (1) and (2), it can be concluded that under the condition of vina=ref and ina=inb±$V_{err}$, when $T_3$-$T_0$=0111, it is satisfied that ina=inb, and when $T_3$-$T_0$=0110, it is satisfied that ina=inb-$V_{ad}$, when $T_3$-$T_0$=1000, it is satisfied that ina=inb+$V_{ad}$. Therefore, when the counter circuit counts to $D_3$-$D_0$=0111, the parameter calibration circuit 0 detects that this state meets the accuracy requirement, and outputs the signal $L_0$ to latch the signal 0111 through the parameter calibration latch circuit 0, for obtaining an output signal $a_3$-$a_0$=0111. The output signal $a_3$-$a_0$=0111 is output to the parameter calibration selection circuit 0, which selects the output signal $a_3$-$a_0$=0111 and outputs it to $A_3$-$A_0$ through the signal $L_0$. At this time, $T_3$-$T_0$ will remain as 0111 until the chip is powered off, and then the above calibration is repeated.

Figure 5:
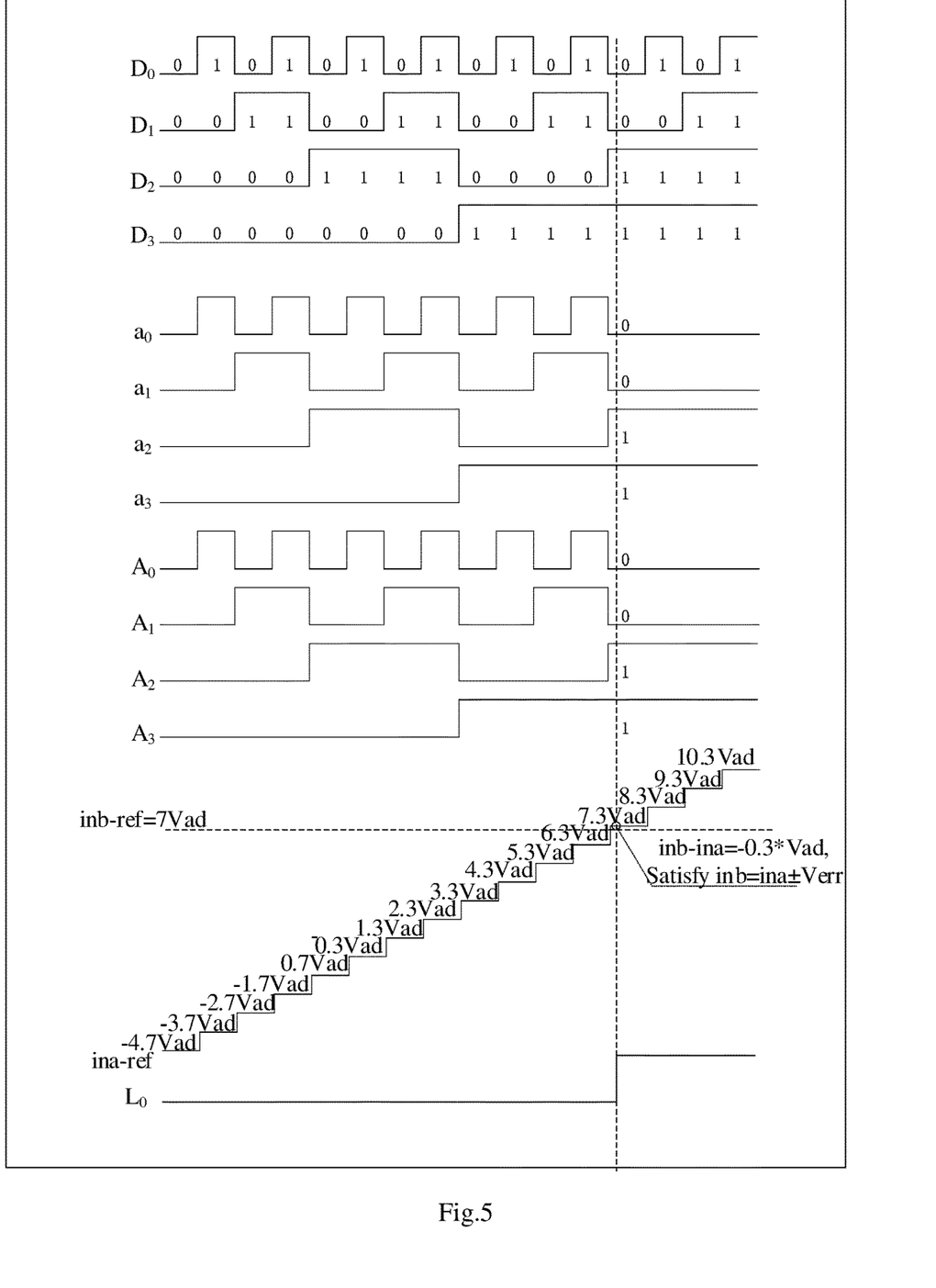
FIG. 5 is a working flow chart of a parameter calibration circuit when $V_{os}=-4.7*Vad$.

When $V_{os}$=-4.7*Vad, the calibration flow diagram of parameter calibration circuit 0 is shown in FIG. 5. Combining equations (1) and (2), it can be concluded that under the conditions of vina=ref and ina=inb±$V_{err}$, when $T_3$-$T_0$=1100, it is satisfied that ina=inb+0.3*Vad, when $T_3$-$T_0$=1011, it is satisfied that ina=inb-0.7$V_{ad}$, and when $T_3$-$T_0$=1101, it is satisfied that ina=inb+1.3*$V_{ad}$. Therefore, when the counter circuit counts to $D_3$-$D_0$=1100, the parameter calibration circuit 0 detects that this state meets the accuracy requirement, and outputs the signal $L_0$ to latch the signal 1100 through the parameter calibration latch circuit 0, for obtaining an output signal $a_3$-$a_0$=1100. The output signal $a_3$-$a_0$=1100 is output to the parameter calibration selection circuit 0, which selects the output signal $a_3$-$a_0$=1100 and outputs it to $A_3$-$A_0$ through the signal $L_0$. At this time, $T_3$-$T_0$ will remain as 1100 until the chip is powered off, and then the above calibration is repeated.

Figure 6:
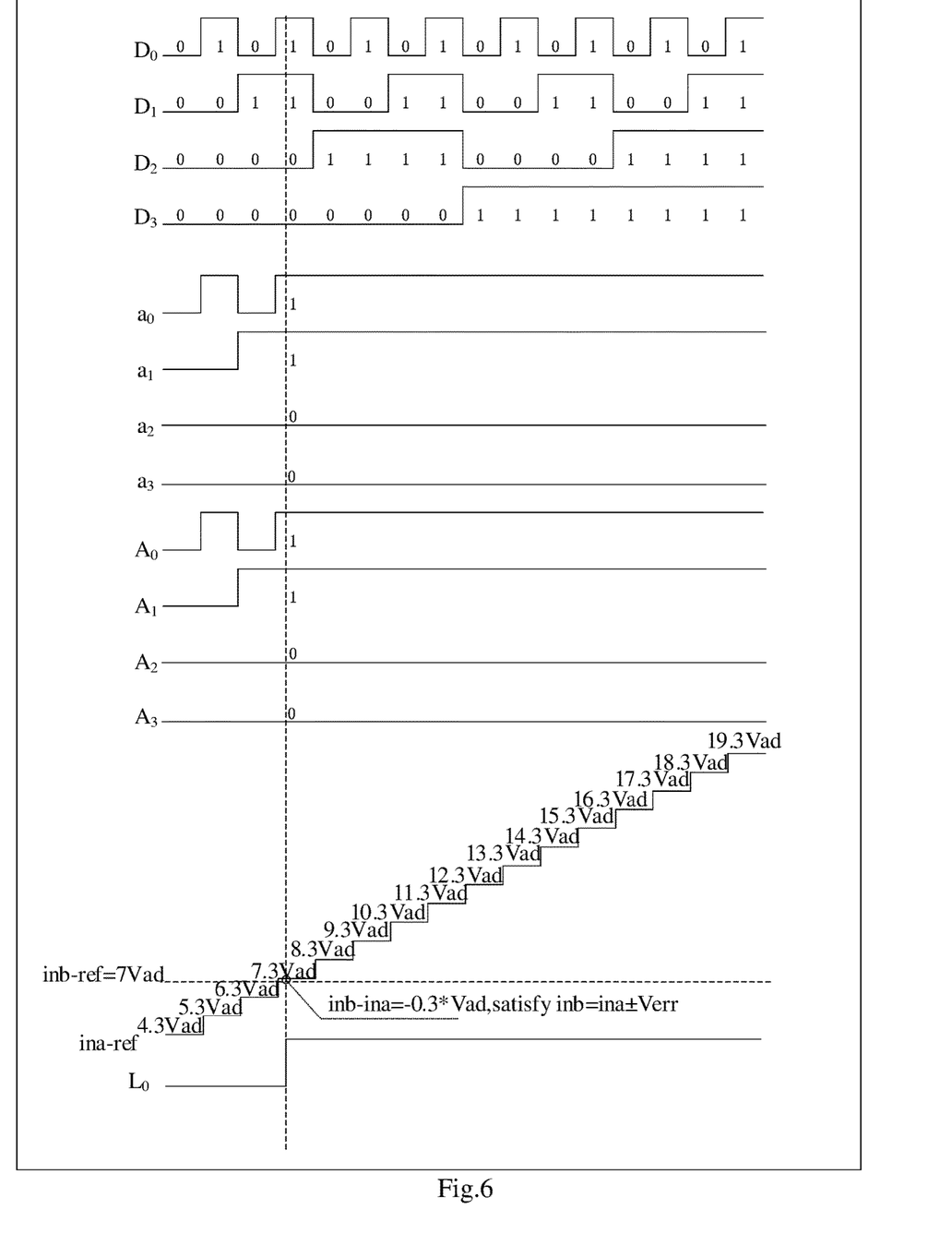
FIG. 6 is a working flow chart of a parameter calibration circuit when $V_{os}=4.3*Vad$.

When $V_{os}$=4.3*Vad, the calibration flow diagram of the parameter calibration circuit 0 is shown in FIG. 6. Combining equations (1) and (2), it can be concluded that under the condition of vina=ref and ina=inb±$V_{err}$, when $T_3$-$T_0$=0011, it is satisfied that ina=inb+0.3*Vad, when $T_3$-$T_0$=0010, it is satisfied that ina=inb-0.7$V_{ad}$, and when $T_3$-$T_0$=0100, it is satisfied that ina=inb+1.3*$V_{ad}$. Therefore, when the counter circuit counts to $D_3$-$D_0$=0011, the parameter calibration circuit 0 detects that this state meets the accuracy requirement, and outputs the signal $L_0$ to latch the signal 0011 through the parameter calibration latch circuit 0, for obtaining an output signal $a_3$-$a_0$=0011. The output signal $a_3$-$a_0$=0011 is output to the parameter calibration selection circuit 0, which selects the output signal $a_3$-$a_0$=0011 and outputs it to $A_3$-$A_0$ through the signal $L_0$. At this time, $T_3$-$T_0$ will remain as 0011 until the chip is powered off, and then the above calibration is repeated.

Based on the same technical concept, this disclosure further provides a chip which includes any one of the self-calibration circuit for chip parameter offset upon power-up discussed above.

Based on the same technical concept, this disclosure further provides a self-calibration method for chip parameter offset upon power-up, which including:

S101, outputting a sequentially scanned counting signal when receiving a valid enabling signal which indicates a completion of chip power-up, by a counting circuit;

S102, latching the counting signal currently output by the counting circuit when receiving a valid latch signal, by a calibration data latch circuit;

S103, selecting the counting signal latched by the calibration data latch circuit as a calibration signal for outputting when receiving the valid latch signal, and selecting the counting signal currently output by the counting circuit as the calibration signal for outputting when not receiving the valid latch signal, by a calibration data selection circuit; and S104, implementing a parameter calibration based on the calibration signal output by the calibration data selection circuit in a calibration mode, and outputting the valid latch signal when the parameter calibration satisfies a preset requirement, by a parameter calibration circuit.

Preferably, there are a plurality of calibration data latch circuits, a plurality of calibration data selection circuits, and a plurality of parameter calibration circuits, and wherein each parameter corresponds to one calibration data latch circuit, one calibration data selection circuit and one parameter calibration circuit.

In a preferable embodiment, the method further includes:

S105, setting the parameter calibration circuit in the calibration mode when not receiving the calibration completion signal, S106, outputting a calibration completion signal to all of the parameter calibration circuits when the parameter calibration circuits all output the valid latch signal, by a parameter calibration completion circuit; and S107, switching the parameter calibration circuit from the calibration mode to a normal working mode after receiving the calibration completion signal.

Preferably, the counting signal is a binary signal, wherein when the counting circuit receives the valid enabling signal EN which indicates a completion of chip power-up, the counting circuit outputs the binary signal which just includes zero, and then the binary signal is incremented step by step until the binary signal just includes one, wherein one is added in each increment.

The chip, self-calibration circuit and method for chip parameter offset upon power-up provided in this disclosure, have following beneficial effects. Through the self-calibration for the chip parameter upon power-up during the system working process, the parameter offsets caused by wiring and plastic packaging and the parameter deviation caused by system parasitism have been included at this time. Accordingly, all possible errors under the working conditions of the chip system are included. On this basis, the parameter calibration can achieve higher accuracy. Accordingly, the present disclosure has realized a parameter calibration which has higher accuracy and flexibility but requires no special process, so can be implemented in a cheaper way. The circuit structure is simple, and the cost is low. In additional, the detection and calibration are implemented in each time of power-up, which avoids the problem that the traditional fuse and OTP burn-in and adjustment method can only be calibrated once. Accordingly, the self-calibration of this disclosure has a high flexibility, and its integrated self-detection function can also improve the parameter detection accuracy.

The foregoing specific description has been described with reference to various embodiments. However, those skilled in the art will recognize that various modifications and changes can be made without departing from the scope of the present disclosure. Therefore, consideration of the present disclosure will be in an illustrative rather than a restrictive sense, and all such modifications will be included within the scope thereof. Also, the advantages of various embodiments, other advantages, and the solutions to problems have been described above. However, the benefits, advantages, solutions to problems, and any elements that can produce these, or solutions that make them more explicit, should not be interpreted as critical, necessary, or essential. The term "comprising", "including" and any other variants thereof used herein are non-exclusive, so that the process, method, document, or device that includes a list of elements includes not only these elements, but also other elements that are not explicitly listed or do not belong to the process, method, system, document, or device. Furthermore, the term "coupling" and any other variations thereof used herein refer to physical connection, electrical connection, magnetic connection, optical connection, communication connection, functional connection, and/or any other connection.

The above-mentioned examples merely represent several embodiments, giving specifics and details thereof, but should not be understood as limiting the scope of this disclosure thereby. It should be noted that a person of ordinary skill in the art could also make several variations and improvements without departing from the concept of this disclosure, and these variations and improvements would all fall within the scope of protection of this disclosure. Therefore, the scope of protection of this disclosure should be in accordance with the appended claims.

What is claimed is:

1. A self-calibration circuit for chip parameter offset upon power-up, comprising:
    a counting circuit, which is operable to output a sequentially scanned counting signal when receiving a valid enabling signal which indicates a completion of chip power-up;
    a calibration data latch circuit, which is connected with the counting circuit and operable to latch the counting signal currently output by the counting circuit when receiving a valid latch signal;
    a calibration data selection circuit, which is respectively connected with the counting circuit and the calibration data latch circuit, and is operable to select the counting signal latched by the calibration data latch circuit as a calibration signal for outputting when receiving the valid latch signal, and to select the counting signal currently output by the counting circuit as the calibration signal for outputting when not receiving the valid latch signal; and
    a parameter calibration circuit, which is respectively connected with the calibration data latch circuit and the calibration data selection circuit, and is operable to implement a parameter calibration based on the calibration signal output by the calibration data selection circuit in a calibration mode, and to output the valid latch signal when the parameter calibration satisfies a preset requirement.

2. The self-calibration circuit for chip parameter offset upon power-up according to claim 1, wherein there are a plurality of calibration data latch circuits, a plurality of calibration data selection circuits, and a plurality of parameter calibration circuits, and wherein each parameter corresponds to one calibration data latch circuit, one calibration data selection circuit and one parameter calibration circuit.

3. The self-calibration circuit for chip parameter offset upon power-up according to claim 2, wherein the self-calibration circuit for chip parameter offset upon power-up further comprises:
    a parameter calibration completion circuit, which is connected with the parameter calibration circuits, and is operable to output a calibration completion signal to all of the parameter calibration circuits when the parameter calibration circuits all output the valid latch signal;
    wherein the parameter calibration circuit is in the calibration mode when not receiving the calibration completion signal, and switches from the calibration mode to a normal working mode after receiving the calibration completion signal.

4. The self-calibration circuit for chip parameter offset upon power-up according to claim 1, wherein the counting signal is a binary signal, wherein when receiving the valid enabling signal which indicates a completion of chip power-up, the counting circuit is operable to output the binary signal which just includes zero, and then the binary signal is incremented step by step until the binary signal just includes one, wherein one is added in each increment.

5. A chip comprising a self-calibration circuit for chip parameter offset upon power-up, wherein the self-calibration circuit for chip parameter offset upon power-up comprises:
    a counting circuit, which is operable to output a sequentially scanned counting signal when receiving a valid enabling signal which indicates a completion of chip power-up;
    a calibration data latch circuit, which is connected with the counting circuit and operable to latch the counting signal currently output by the counting circuit when receiving a valid latch signal;
    a calibration data selection circuit, which is respectively connected with the counting circuit and the calibration data latch circuit, and is operable to select counting signal latched by the calibration data latch circuit as a calibration signal for outputting when receiving the valid latch signal, and to select the counting signal currently output by the counting circuit as the calibration signal for outputting when not receiving the valid latch signal; and
    a parameter calibration circuit, which is respectively connected with the calibration data latch circuit and the calibration data selection circuit, and is operable to implement a parameter calibration based on the calibration signal output by the calibration data selection circuit in a calibration mode, and to output the valid latch signal when the parameter calibration satisfies a preset requirement.

6. The chip according to claim 5, wherein there are a plurality of calibration data latch circuits, a plurality of calibration data selection circuits, and a plurality of parameter calibration circuits, and wherein each parameter corresponds to one calibration data latch circuit, one calibration data selection circuit and one parameter calibration circuit.

7. The chip according to claim 6, wherein the self-calibration circuit for chip parameter offset upon power-up further comprises:
a parameter calibration completion circuit, which is connected with the parameter calibration circuits, and is operable to output a calibration completion signal to all of the parameter calibration circuits when the parameter calibration circuits all output the valid latch signal;
wherein the parameter calibration circuit is in the calibration mode when not receiving the calibration completion signal, and switches from the calibration mode to a normal working mode after receiving the calibration completion signal.

8. The chip according to claim 5, wherein the counting signal is a binary signal, wherein when receiving the valid enabling signal which indicates a completion of chip power-up, the counting circuit is operable to output the binary signal which just includes zero, and then the binary signal is incremented step by step until the binary signal just includes one, wherein one is added in each increment.

9. A self-calibration method for chip parameter offset upon power-up, comprising:
outputting a sequentially scanned counting signal when receiving a valid enabling signal which indicates a completion of chip power-up, by a counting circuit;
latching the counting signal currently output by the counting circuit when receiving a valid latch signal, by a calibration data latch circuit;
selecting counting signal latched by the calibration data latch circuit as a calibration signal for outputting when receiving the valid latch signal, and selecting the counting signal currently output by the counting circuit as the calibration signal for outputting when not receiving the valid latch signal, by a calibration data selection circuit;
implementing a parameter calibration based on the calibration signal output by the calibration data selection circuit in a calibration mode, and outputting the valid latch signal when the parameter calibration satisfies a preset requirement, by a parameter calibration circuit.

10. The self-calibration method for chip parameter offset upon power-up according to claim 9, wherein there are a plurality of calibration data latch circuits, a plurality of calibration data selection circuits, and a plurality of parameter calibration circuits, and wherein each parameter corresponds to one calibration data latch circuit, one calibration data selection circuit and one parameter calibration circuit.

11. The self-calibration method for chip parameter offset upon power-up according to claim 10, wherein, the self-calibration method for chip parameter offset upon power-up further comprises:
setting the parameter calibration circuit in the calibration mode when not receiving the calibration completion signal,
outputting a calibration completion signal to all of the parameter calibration circuits when the parameter calibration circuits all output the valid latch signal, by a parameter calibration completion circuit; and
switching the parameter calibration circuit from the calibration mode to a normal working mode after receiving the calibration completion signal.

12. The self-calibration method for chip parameter offset upon power-up according to claim 9, wherein the counting signal is a binary signal, wherein when receiving the valid enabling signal which indicates a completion of chip power-up, the counting circuit is operable to output the binary signal which just includes zero, and then the binary signal is incremented step by step until the binary signal just includes one, wherein one is added in each increment.

* * * * *